(12) United States Patent
Kubota et al.

(10) Patent No.: US 8,529,785 B2
(45) Date of Patent: Sep. 10, 2013

(54) METAL OXIDE

(75) Inventors: Makoto Kubota, Yokohama (JP); Kaoru Miura, Matsudo (JP); Toshihiro Ifuku, Yokohama (JP); Jumpei Hayashi, Yokohama (JP); Masaki Azuma, Kyoto (JP); Olga Alexandrovna Smirnova, Uji (JP); Hiroshi Funakubo, Yokohama (JP); Hiroshi Uchida, Tokyo (JP); Nobuhiro Kumada, Kofu (JP); Satoshi Wada, Kofu (JP); Takashi Iijima, Tsukuba (JP); Soichiro Okamura, Tokyo (JP)

(73) Assignees: Canon Kabushiki Kaisha, Tokyo (JP); Kyoto University, Kyoto-shi (JP); Tokyo Institute of Technology, Tokyo (JP); Sophia University, Tokyo (JP); University of Yamanashi, Kofu-shi (JP); National Institute of Advanced Industrial Science and Technology, Tokyo (JP); Tokyo University of Science Educational Foundation Administrative Organization, Tokyo (JP)

( * ) Notice: Subject to any disclaimer, the term of this patent is extended or adjusted under 35 U.S.C. 154(b) by 914 days.

(21) Appl. No.: 12/508,968

(22) Filed: Jul. 24, 2009

(65) Prior Publication Data
US 2010/0025617 A1 Feb. 4, 2010

(30) Foreign Application Priority Data
Jul. 30, 2008 (JP) .................................. 2008-196903

(51) Int. Cl.
*C04B 35/495* (2006.01)
*C04B 35/00* (2006.01)
*H01L 41/18* (2006.01)
*H01L 41/187* (2006.01)

(52) U.S. Cl.
USPC .............................. 252/62.9 PZ; 252/62.9 R

(58) Field of Classification Search
USPC ...................................... 252/62.9 R, 62.9 PZ
See application file for complete search history.

(56) References Cited

U.S. PATENT DOCUMENTS

| | | | |
|---|---|---|---|
| 7,525,239 B2* | 4/2009 | Aoki et al. ..................... 310/358 |
| 8,034,250 B2* | 10/2011 | Hayashi et al. ......... 252/62.9 PZ |
| 8,114,307 B2* | 2/2012 | Aoki et al. ............... 252/62.9 R |
| 2006/0045840 A1 | 3/2006 | Chen et al. |
| 2006/0172880 A1 | 8/2006 | Shirakawa et al. |
| 2009/0315432 A1 | 12/2009 | Furuta et al. |
| 2010/0081559 A1 | 4/2010 | Zhang et al. |

FOREIGN PATENT DOCUMENTS

| | | |
|---|---|---|
| JP | 2007-287739 A | 11/2007 |
| WO | 2009/116683 A1 | 9/2009 |
| WO | 2010/079838 A1 | 7/2010 |

OTHER PUBLICATIONS

Matthew R. Suchomel et al., "Bi2ZnTiO6: A Lead-Free Closed-Shell Polar Perovskite with a Calculated Ionic Polarization of 150 μC cm-2," 18(21) Chem. Mater. 4987-89 (2006).
Joel Zylberberg et al., "Bismuth Aluminate: A New High-TC Lead-Free Piezo-/ferroelectric," 19(26) Chem. Mater. 6385-90 (2007).

\* cited by examiner

*Primary Examiner* — Carol M Koslow
*Assistant Examiner* — Matthew E Hoban
(74) *Attorney, Agent, or Firm* — Fitzpatrick, Cella, Harper & Scinto

(57) ABSTRACT

Provided is a piezoelectric material excellent in piezoelectricity. The piezoelectric material includes a perovskite-type complex oxide represented by the following General Formula (1).

$$A(Zn_xTi_{(1-x)})_yM_{(1-y)}O_3 \qquad (1)$$

wherein A represents at least one kind of element containing at least a Bi element and selected from a trivalent metal element; M represents at least one kind of element of Fe, Al, Sc, Mn, Y, Ga, and Yb; x represents a numerical value satisfying $0.4 \leq x \leq 0.6$; and y represents a numerical value satisfying $0.1 \leq y \leq 0.9$.

12 Claims, 1 Drawing Sheet

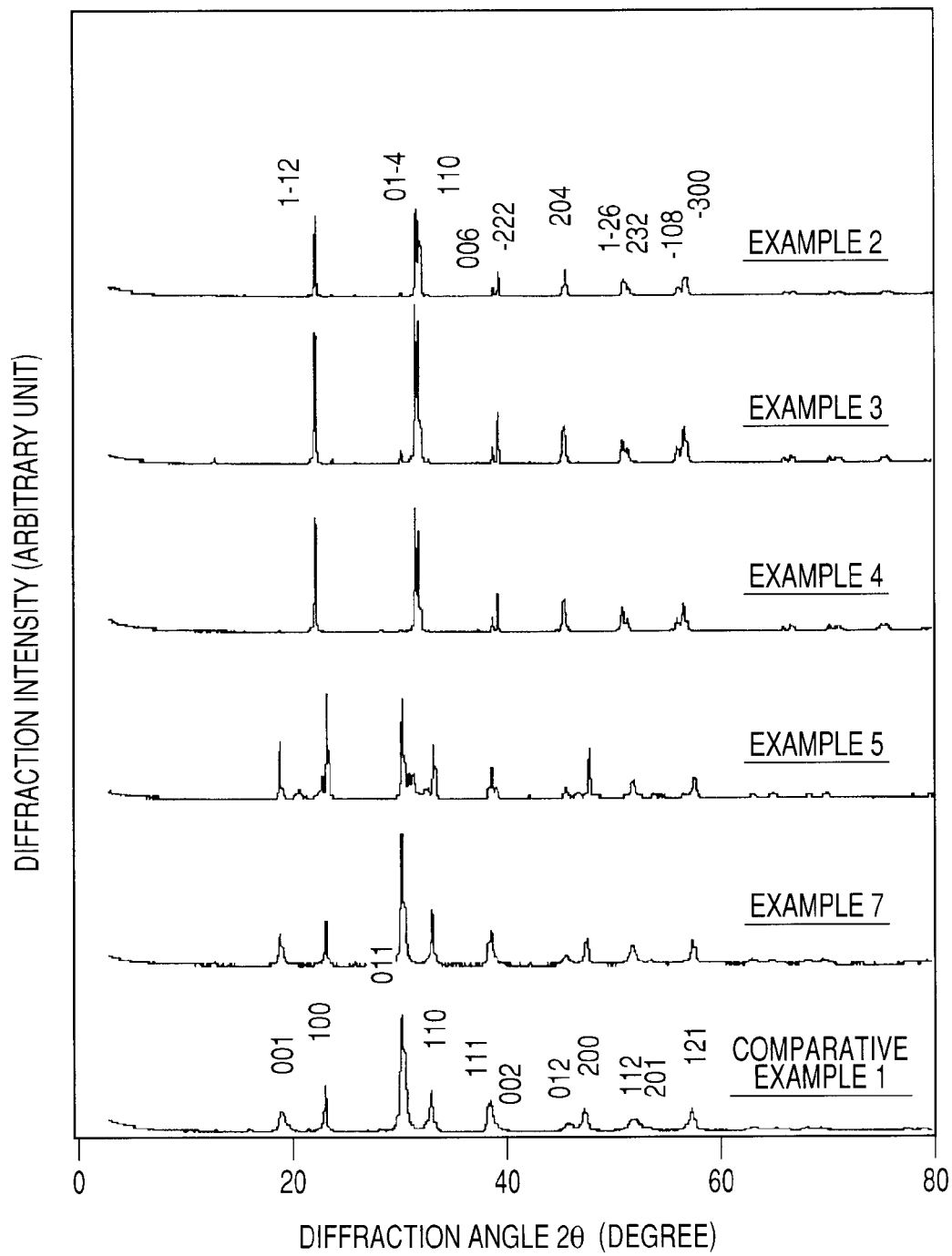

METAL OXIDE

BACKGROUND OF THE INVENTION

1. Field of the Invention

The present invention relates to a metal oxide having piezoelectricity. In particular, the present invention relates to a novel piezoelectric material made of a lead-free metal oxide.

2. Description of the Related Art

As piezoelectric ceramics, $ABO_3$-type ceramics such as lead zirconate titanate (hereinafter, referred to as "PZT") is generally used.

However, PZT contains lead as an A-site element, and hence its effect on the environment is considered as a problem. Therefore, a piezoelectric material using a perovskite-type oxide containing no lead has been proposed.

For example, as a piezoelectric material made of a perovskite-type oxide containing no lead, "Chemistry of Materials" 2006, Vol. 18, No. 21, pp. 4987-4989 describes $Bi(Zn_{0.5}Ti_{0.5})O_3$ as a Bi-based material. $Bi(Zn_{0.5}Ti_{0.5})O_3$ is expected to exhibit excellent theoretical piezoelectric performance. However, it is difficult to polarize $Bi(Zn_{0.5}Ti_{0.5})O_3$ due to a high Curie temperature, and hence the piezoelectric performance thereof has not been clarified.

Further, a piezoelectric material containing $BiFeO_3$ as a main component has been proposed. For example, Japanese Patent Application Laid-Open No. 2007-287739 discloses a $BiFeO_3$-based material containing La in an A-site. $BiFeO_3$ is a satisfactory ferroelectric material, and reportedly exhibits a high remnant polarization amount at a low temperature. However, $BiFeO_3$ has a problem in that the displacement range cannot be kept large under an electric field application due to its low insulation performance.

Further, "Chemistry of Materials" 2007, Vol. 19, No. 26, pp. 6385-6390 discloses a $BiAlO_3$ piezoelectric material obtained by a high-pressure synthesis method. However, the piezoelectricity of $BiAlO_3$ has not reached a practically applicable range yet.

The present invention has been achieved in order to solve the above problems, and an object thereof is to provide a Bi-based piezoelectric material excellent in performance as a piezoelectric material.

SUMMARY OF THE INVENTION

A compound to solve the above problem is a metal oxide including a perovskite-type oxide represented by the following General Formula (1):

(1)

wherein A represents at least one kind of element containing at least a Bi element and selected from a trivalent metal element; M represents at least one kind of element of Fe, Al, Sc, Mn, Y, Ga, and Yb; x represents a numerical value satisfying $0.4 \leq x \leq 0.6$; and y represents a numerical value satisfying $0.1 \leq y \leq 0.9$.

According to the present invention, a metal oxide having satisfactory piezoelectricity can be provided.

Further, the metal oxide of the present invention has no effect on the environment because the metal oxide does not use lead. Further, the metal oxide of the present invention is advantageous in terms of durability when used for a piezoelectric device because the metal oxide does not use an alkali metal.

Further features of the present invention will become apparent from the following description of exemplary embodiments with reference to the attached drawings.

BRIEF DESCRIPTION OF THE DRAWINGS

FIGURE is an X-ray diffraction chart showing crystalline states of piezoelectric materials in Examples 2 to 5 and 7 of the present invention and a metal oxide material in Comparative Example 1.

DESCRIPTION OF THE EMBODIMENTS

Hereinafter, embodiments for carrying out the present invention are described.

The present invention provides a novel piezoelectric material having satisfactory piezoelectricity and containing a Bi-based piezoelectric body excellent in performance as a piezoelectric body. Note that the piezoelectric material of the present invention may be used for various applications, such as the use for a capacitor material utilizing dielectric properties. Hereinafter, the present invention is described as a piezoelectric material, but it goes without saying that the application of the metal oxide of the present invention is not limited to a piezoelectric material.

A piezoelectric material according to the present invention is a metal oxide including a perovskite-type oxide represented by the following General Formula (1):

(1)

wherein A represents at least one kind of element containing at least a Bi element and selected from a trivalent metal element; M represents at least one kind of element of Fe, Al, Sc, Mn, Y, Ga, and Yb; x represents a numerical value satisfying $0.4 \leq x \leq 0.6$; and y represents a numerical value satisfying $0.1 \leq y \leq 0.9$.

The perovskite-type oxide is generally expressed by a chemical formula: $ABO_3$. In the perovskite-type oxide, elements A and B in the shape of an ion occupy particular positions of a unit crystal lattice called an A-site and a B-site, respectively. For example, in a unit crystal lattice of a cubic system, the A-element is positioned at a vertex of the cube and the B-element is positioned at a body-center position. An O element occupies a face-centered position as an anion of oxygen.

Metal oxide represented by the above General Formula (I) refers to a solid solution of a plurality of perovskite-type oxides represented by $A(Zn_xTi_{(1-x)})O_3$ and $AMO_3$. In General Formula (I), A is a metal element mainly positioned at the A-site and $(Zn_xTi_{(1-x)})$ and M are elements positioned mainly at the B-site.

In General Formula (1), the number of metals is the same between the A-site and the B-side in terms of an ideal composition ratio. When the number of metals at the A-site is excessively larger or smaller than that at the B-site, excessive amounts of metals are precipitated at a crystal grain boundary and a deficient content becomes a defective site, for example, which may have an adverse effect on insulation performance. The allowable range of a molar ratio of the amount of metals at the A-site with respect to that at the B-site, i.e. A site/B site is 0.95 or more to 1.30 or less. When the amount of metals at the A-site departs from the above range, piezoelectricity as well as insulation performances are degraded remarkably.

A is formed of a trivalent metal element containing Bi as a main component. In this case, a single substance of $A(Zn_xTi_{(1-x)})O_3$ has a tetragonal structure with a large aspect ratio.

A most preferred value of x representing the ratio of Zn to Ti is 0.5. If Zn is present as a divalent cation and Ti is present as a tetravalent cation in a crystal lattice, because the balance of charge is good when x is 0.5, the insulation performance of the entire oxide is enhanced. Depending upon the B-site element and the kind of a dopant, x may be changed in a range of 0.4 to 0.6 for the purpose of enhancing insulation properties.

M is selected from any of Fe, Al, Sc, Mn, Y, Ga, and Yb in General Formula (I), or a combination thereof. More preferably, in General Formula (I), M is formed of at least one of Fe and Al, or both of these elements.

The metal ion is selected as M, whereby a single substance of $AMO_3$ takes a non-tetragonal structure such as a rhombohedral structure or a monoclinic structure. The reason is as follows.

In general, the crystal structure of a perovskite-type oxide $ABO_3$ is related to a tolerance factor. The tolerance factor t is a parameter defined by the following mathematical expression (1).

$$t=(r_A+r_O)/\sqrt{2}(r_B+r_O) \quad \text{MATHEMATICAL EXPRESSION (1)}$$

In the expression, $r_A$, $r_B$, and $r_O$ represent ion radii of A, B, and O. Regarding a value of each ion radius, several kinds of values have already been obtained for almost all the elements. In the case where A and B are composed of a plurality of elements, an averaged ion radius is obtained using an ion radius of each constituent element and its composition ratio, and the value is defined as $r_A$ or $r_B$.

In the case where A is Bi, the crystal structure of $ABO_3$ and the tolerant factor t have a close relationship. Herein, if the above element of M, i.e., any of Fe, Al, Sc, Mn, Y, Ga, and Yb, or a combination thereof is selected as B, the value of t is less than 1.006, and a rhombohedral structure, and then, a monoclinic structure become the most stable structures. In the case where M is Fe or Al, in particular, the valence of ions is stable and the insulation performances are high, and hence a more stable rhombohedral structure is obtained.

$A(Zn_xTi_{(1-x)})O_3$ that is a tetragonal structure individually and $AMO_3$ that is a non-tetragonal structure are formed into a solid solution, whereby the piezoelectric effect of the solid solution with respect to an external electric field increases. At this time, when the range of y representing a solid solution ratio between both the structures is $0.1 \leq y \leq 0.9$, better than the piezoelectric performance of a single substance of $A(Zn_xTi_{(1-x)})O_3$ or $AMO_3$ is obtained. When the value of y is smaller than 0.1, the influence of the properties of an $AMO_3$ becomes large, with the result that a dielectric loss may be increased. On the contrary, when the value of y is smaller than 0.9, the influence of properties of an $A(Zn_xTi_{(1-x)})O_3$ becomes larger, with the result that a sintering density may be decreased.

Further, when the range of y is $0.2 \leq y \leq 0.65$, which is close to a morphotropic phase boundary between a tetragonal structure and a non-tetragonal structure, a large piezoelectric effect can be expected.

The reason why the above range of y is a preferable range is that a morphotropic phase boundary is present in such a range. This is also shown by the result of the electronic state calculation called a first principles calculation. Hereinafter, the outline and result of the electronic state calculation are described.

The electronic state calculation including structure optimization using a tetragonal structure and a rhombohedral structure as an initial structure is performed with respect to $BiFeO_3$ and $Bi(Zn_{0.5}Ti_{0.5})O_3$, and each of the differences in entire energy obtained from the electronic state calculation is obtained. When the difference in entire energy is defined as the function of y in $Bi(Zn_{0.5}Ti_{0.5})_yFe_{(1-y)}O_3$, the differences in entire energy of $BiFeO_3$ and $Bi(Zn_{0.5}Ti_{0.5})O_3$ correspond to the differences in entire energy of y=0 and y=1, respectively. Then, y, which is obtained when both of them are connected with a straight line and the difference in entire energy becomes zero, is expected as y at which a morphotropic phase boundary appears.

According to the result of the electronic state calculation, the value of a difference obtained by subtracting the entire energy of the rhombohedral structure from the entire energy of the tetragonal structure of $BiFeO_3$ was 0.261 eV/unit lattice. Similarly, the difference in entire energy of $Bi(Zn_{0.5}Ti_{0.5})O_3$ was −0.28 eV/unit lattice. It was found from the above that the value of y, when both the metal oxides were mixed and the difference in entire energy became zero, was 0.48.

The result of the above electronic state calculation shows that y in the vicinity of 0.48, for example, $0.2 \leq y \leq 0.65$, is preferred in a bulk solid of the present invention.

It is preferred that A in General Formula (1) contain only a Bi element, or a Bi element and at least one element selected from trivalent lanthanoid.

A is made of only a trivalent Bi-based metal element, whereby a perovskite skeleton composed of an A-site element and an O element becomes stable electrically.

When A is made of only a Bi element, the symmetry of a perovskite skeleton composed of an A-site element and an O element increases, whereby the stability of a piezoelectric material with respect to the external stimulus is enhanced. Further, the effects of raising the Curie temperature of the piezoelectric material and enlarging a fluctuation range of internal polarization due to the strong bonding peculiar to the Bi element are obtained.

In the case where the piezoelectric material is subjected to a polarization treatment from outside, it is preferred that A also contain a trivalent lanthanoid element for the purpose of adjusting the Curie temperature. Further, because A contains a lanthanoid element, the piezoelectric material of the present invention can be easily synthesized at an ambient pressure.

Examples of the lanthanoid elements that can become trivalent include La, Ce, Pr, Tm, and Yb. Of those, La is most preferred out of the lanthanoid elements to be contained in A, and an La element is excellent in a solid solubility into other components.

When A contains at least Bi and a lanthanoid element, for example, La, the ratio of Bi occupying A is preferably 70 mol % or more to 99.9 mol % or less, and in particular, 90 mol % or more to 99.9 mol % or less. If the ratio of Bi occupying A is less than 70 mol %, the insulation performances of the piezoelectric material of the present invention may be degraded. On the contrary, when the ratio of Bi occupying A exceeds 99.9 mol %, the performance almost equal to that in the case where a lanthanoid element is not added is obtained. Further, when the lanthanoid is added, in addition to the effect of adjusting the Curie temperature, there is an advantage in that a system that is synthesized only by high-pressure synthesis and in a thin film system with a stress applied thereto can be synthesized at an ambient pressure. Even in this case, the above addition amounts are preferred in terms of the effect.

It should be noted that, in the present invention, mol % refers to the amount of substance of a specified element with respect to the total amount of substance occupying a specified site by a percentage.

The Curie temperature desired in the piezoelectric material of the present invention is 200° C. or higher to lower than 600° C., and more preferably 200° C. or higher to 500° C. or lower. If the Curie temperature is equal to or higher than 200° C., when the piezoelectric material is used in a device, a material with less fluctuation in characteristics depending upon temperature can be provided. Further, if the Curie temperature is equal to or lower than 600° C., a material that can be polarized easily during the formation of a device can be provided.

Generally, as the ratio of the lanthanoid element contained in A is larger, the Curie temperature tends to decrease.

Further, it is preferred that M contain an Mn element in an amount of 0.1 mol % or more to 5 mol % or less, and in particular, 0.1 mol % or more to 1 mol % or less.

When the piezoelectric material of the present invention contains an appropriate amount of Mn, the insulation performance of the piezoelectric material is enhanced. A highly insulative piezoelectric material has an advantage in that it can withstand a polarization treatment under a high voltage and is also excellent in conversion efficiency between electric energy and mechanical energy.

Further, when the piezoelectric material of the present invention contains an appropriate amount of Mn, a piezoelectric material may be polarized by a lower voltage.

As a material to be contained in the piezoelectric material of the present invention, Mn may be bivalent Mn or quadrivalent Mn.

The same effects can be expected when Mn is contained in a crystal grain boundary as an oxide, as well as when Mn is contained in the B-site of the perovskite structure.

When the content of Mn contained in M is smaller than 0.1 mol %, the enhancement range of the insulation performances decrease. On the contrary, when the content of Mn contained in the B-site is larger than 5 mol %, the piezoelectric effect of the piezoelectric material may be decreased.

It is desired that the piezoelectric material be a film having a thickness of 200 nm or more to 10 μm or less, and more preferably 300 nm or more to 3 μm or less and provided on a substrate.

By setting the film thickness of the piezoelectric material to be 200 nm or more to 10 μm or less, an electromechanical conversion function sufficient as a piezoelectric device is obtained and the increase in density of the piezoelectric device can be expected.

There is no particular limit to a method for stacking the film. Examples of the method include a chemical solution deposition method (CSD method, may be called sol-gel method), a sputtering method, a pulse laser deposition method (PLD method), a hydrothermal synthesis method, and an aerosol deposition method (AD method). Of those, the most preferred stack method is the chemical solution deposition method. The chemical solution deposition method is a film-formation method excellent in precise control of a metal composition.

The chemical solution deposition method in the present invention collectively refers to a film-formation method of obtaining intended metal oxides by applying a precursor solution of the intended metal oxides to a substrate, followed by heating and crystallization. Generally, the chemical solution deposition method includes film-formation methods called a CSD method, a sol-gel method, and an organic metal decomposition method.

Examples of a metal compound to be contained in the precursor solution include a hydrolysable or pyrolyzable organic metal compound. Typical examples thereof include a metal alkoxide of metal contained in an intended material, an organic acid salt, and a metal complex such as a β-diketone complex.

Although there is no particular limit to a material for a substrate on which a film-shaped piezoelectric material is provided, a material that is not deformed or melted during a sintering step conducted usually at 800° C. or lower is preferred. For example, a single crystal substrate made of magnesium oxide, strontium titanate, or the like, a ceramic substrate made of zirconia, alumina, silica, or the like, a semiconductor substrate made of silicon (Si), tungsten (W), or the like, or a heat-resistant stainless (SUS) substrate is preferably used. These materials may be combined in a plurality of kinds or may be laminated to form a multi-layered configuration. Conductive metal may be doped in a substrate or stacked on the surface of a substrate for the purpose of allowing the conductive metal to additionally function as one of the electrodes of the piezoelectric device.

Of these substrates, it is preferred that a substrate used in the piezoelectric material of the present invention be a single crystal substrate selectively (001) oriented or (111) oriented.

By using a single crystal substrate with particular orientation, a film-shaped piezoelectric material provided on the surface of the substrate can also be oriented strongly in the same orientation. When the piezoelectric material has (001) orientation or (111) orientation, the moment of polarization is aligned in a direction perpendicular to the film, and hence the enhancement of the piezoelectric effect can be expected.

In the film-shaped piezoelectric material, the range of y is preferably $0.2 \leq y \leq 0.35$. In a composition range in which y is smaller than 0.2, the properties of $ABO_3$ that has a non-tetragonal structure become prevalent. On the contrary, in a composition range in which y is larger than 0.35, the properties of $A(Zn_xTi_{(1-x)})O_3$ become prevalent. When the range of y is $0.2 \leq y \leq 0.35$, the effect of a morphotropic phase boundary of $ABO_3$ and $A(Zn_xTi_{(1-x)})O_3$ is exhibited, with the result that piezoelectricity and dielectricity increase. It can be confirmed from the mixing of a tetragonal structure and a non-tetragonal structure in an X-ray diffraction measurement or the like that the composition range is in the vicinity of the morphotropic phase boundary.

It is preferred that the piezoelectric material be a bulk solid, and the range of y be $0.35 \leq y \leq 0.65$.

In the present invention, the term "bulk solid" is used for expressing the shape of the piezoelectric material, and refers to a massive substance in which powder is aggregated. The specific surface area with respect to a volume and a weight of the bulk body is smaller than that of the film-shaped piezoelectric material. The piezoelectric material of a lamination type in which a plurality of layers of the piezoelectric material and an internal electrode are laminated is also dealt with as the bulk solid in the present invention.

In the case where the piezoelectric material of the present invention is a bulk solid, in the composition range in which y is smaller than 0.35, the properties of $ABO_3$ that has a non-tetragonal structure become dominant. Conversely, in the composition range in which y is larger than 0.65, the properties of $A(Zn_xTi_{(1-x)})O_3$ become dominant. On the contrary, when the range of y is $0.35 \leq y \leq 0.65$, the effect of a morphotropic phase boundary of $ABO_3$ and $A(Zn_xTi_{(1-x)})O_3$ is exhibited, with the result that piezoelectricity and dielectricity increase. It can be confirmed from the mixing of a tetragonal structure and a non-tetragonal structure in an X-ray diffraction measurement or the like that the composition range is in the vicinity of the morphotropic phase boundary.

The preferred range of y particularly varies between when the piezoelectric material of the present invention is a bulk solid and when the piezoelectric material is a thin film. This may be caused by the influence of a stress present inside a thin film for the adhesion to a substrate.

The method of producing the bulk solid is not particularly limited. For example, a general method of producing ceramics, in which material powder is sintered at an ambient pressure, can be adopted.

In the case where A in General Formula (I) is composed only of Bi, the crystallization may become insufficient during sintering at an ambient pressure. In this case, if another kind of energy as used in a high-pressure synthesis method of sintering material powder under pressure is adopted, an intended substance is obtained. In addition, a conductive heating method, a micro wave sintering method, a millimeter wave sintering method, and the like can be used.

The piezoelectric material of the present invention can be used in devices such as an ultrasonic vibrator, a piezoelectric actuator, a piezoelectric sensor, and a ferroelectric memory.

Hereinafter, the present invention is described more specifically by way of examples. Of course, it should be noted that the present invention is not limited to the following examples. Tables 1 and 2 show the presence and absence of ferroelectricity, a Curie temperature, a dielectric constant, and a dielectric loss together with the compositions in the respective examples.

In the following, the piezoelectric materials of the present invention as a bulk solid (Examples 1 to 13) are described in the successive order.

Examples 1 to 11

As oxide materials, $Bi_2O_3$, ZnO, $TiO_2$, $Fe_2O_3$, and $Al_2O_3$ were weighed, mixed, and crushed in the same molar ratios as those of intended compositions shown in Table 1. The powder thus produced was sealed in a capsule made of platinum, and the capsule was pressurized to 6 GPa by a cubic anvil-type high-pressure generating apparatus. The capsule was heated to 1,100° C. under pressure, and held at this temperature for 30 minutes. After that, the capsule was quenched and the pressure was removed. The samples were taken out and piezoelectric materials of the present invention were obtained.

According to the X-ray diffraction measurement, it was found that any of the piezoelectric materials had a perovskite structure. Further, the crystal system thereof was any of a tetragonal system and a rhombohedral system, or a mixed system. FIG. 1 shows the results obtained by performing the X-ray diffraction measurement in a 2θ/θ direction of the piezoelectric materials in Examples 2, 3, 4, 5, and 7.

The surface of each piezoelectric material was polished to form a disk shape with a diameter of 2.5 mm and a thickness of 0.5 mm. Electrodes were formed on both surfaces of the disk by ion coater of gold and used for electric measurement. Table 1 shows the results together with the compositions.

Regarding the ferroelectricity shown in Table 1, a symbol o is described in the case where a P-E hysteresis measurement was conducted in a temperature range of −60° C. to 30° C. and such a hysteresis loop particular to a ferrodielectric material that a self-polarization was inverted by changing the magnitude of an external electric field to be positive or negative was observed. A symbol x is described in the case where a hysteresis loop as a ferroelectric material was not obtained. A symbol - is described in the case where a sample for measurement was not obtained.

The Curie temperature was measured by an X-ray diffraction apparatus equipped with a heating/cooling unit and an impedance analyzer. The Curie temperature described in Table 1 was specified by the temperature at which a crystal phase was transited or the dielectric constant showed local maximum when the X-ray diffraction measurement and dielectric constant measurement were conducted in a range of −150° C. to 600° C.

The dielectric constant and dielectric loss were measured by an impedance analyzer. As the dielectric constant and the dielectric loss described in Table 1, numerical values at 25° C. and 1 kHz were used. As the dielectric constant described in the present specification, values of relative permittivity, which are ratios with respect to a vacuum dielectric constant, are described. The symbol - is described in the case where no sample for the measurement was obtained.

When a voltage of 1 kV/mm was applied to the piezoelectric material of Example 4, and the strain of the piezoelectric material was observed with a laser-Doppler velocimeter, and the strain of 0.1% or more was confirmed. The piezoelectric material of Example 5 was also subjected to the measurement under the same conditions. As a result, a strain of 0.1% or more was observed. Regarding the piezoelectric materials of Examples 1 to 3 and Examples 6 to 11, a strain of 0.05% or more was observed by the same measurement. These strains are displacement ranges sufficient as the piezoelectric materials to be applied to piezoelectric actuators and the like.

Examples 12 and 13

As oxide materials, $Bi_2O_3$, ZnO, $TiO_2$, $Fe_2O_3$, $La_2O_3$, and MnO were weighed, mixed, and crushed in the same molar ratios as those of intended compositions shown in Table 1. To the powder thus produced, 10 wt % of polyvinyl butyral (PVB) was added as a binder, and mixed in a mortar. The mixture was molded into a circular disk shape with a diameter of 10 mm, and calcined in an electric furnace at 700° C. for 2 hours. Then, the mixture was sintered in an electric furnace at 1,100° C. to 1,350° C. for 2 hours, whereby piezoelectric materials of the present invention were obtained.

According to the X-ray diffraction measurement, it was found that any of the piezoelectric materials had a perovskite structure. Both surfaces of these disk-shaped piezoelectric materials were polished and electrodes were provided thereon with a silver paste and used for electric measurement. Table 1 shows the results together with compositions. The Curie temperature, the dielectric constant, and the dielectric loss described in Table 1 were specified in the same way as in Example 1.

The piezoelectric strains of the piezoelectric materials of Examples 12 and 13 were obtained in the same way as in Example 4, and a strain of 0.08% or more was confirmed in any example.

Hereinafter, production examples of film-shaped piezoelectric materials in Examples 14 to 23 are described successively from production examples of precursor solutions.

Examples 14 to 23

Production Example of Precursor Solution

As materials for a precursor solution, tri-t-amyloxybismuth($Bi(O.t-Am)_3$), zinc acetate dihydrate ($Zn(OAc)_2.2H_2O$), tetra-n-butoxytitanium ($Ti(O.n-Bu)_4$), iron acetylacetonate ($Fe(acac)_3$), tri-sec-butoxyaluminum $Al_2O_3(Al(O.sec-Bu)_4)$, tri-i-propoxylanthanum ($La(O.i-Pr)_3$), and di-i-propoxymanganese(II) ($Mn(O.i-Pr)_2$) were used.

To 2-methoxyethanol as a solvent, the above materials in the same molar ratio as that of intended compositions shown in Table 2 were added in terms of metal and dissolved by stirring.

Regarding a system using zinc acetate dihydrate, equimolar monoethanol amine was added for the purpose of aiding and promoting for the solubility of a zinc component.

2-methoxyethanol was added in an appropriate amount and hence the concentration of any solution was 0.1 mol/L, whereby coating solutions used in Examples 14 to 23 were obtained.

Production Example of Film-Shaped Piezoelectric Material

As a substrate on which a thin film was formed, conductive strontium titanate single crystal substrate doped with niobium with (111) orientation was obtained.

The precursor solution corresponding to each example in Table 1 was applied to the above substrate with a spin coater (3,000 rpm). The coated layer was dried by heating at 150° C. for 1 minute with a hot plate to remove the solvent, and thereafter, the coated layer was sintered in a rapid thermal-type infrared annealing (hereinafter, referred to as RTA) furnace at 500° C. for 1 minute, whereby a first layer was formed. Then, a second layer and a third layer were repeatedly stacked on the first layer similarly to obtain a stacked film including 20 layers in total. Finally, the stacked film was sintered and crystallized by RTA at 700° C. for 5 minutes in a nitrogen atmosphere, whereby a piezoelectric material thin film with a film thickness of 400 nm±100 nm of the present invention was obtained.

According to the X-ray diffraction measurement, it was found that any of the piezoelectric materials had a perovskite structure. A platinum electrode with Φ100 μm was provided on the surface of each thin film shaped piezoelectric material by sputtering for electric measurement. Table 2 shows the results together with compositions.

The Curie temperature described in Table 2 was specified by the temperature at which a dielectric constant showed local maximum when dielectric constant measurement was conducted in a range of −150° C. to 330° C. A symbol - was described in the case where no sample for measurement was obtained.

Comparative Examples 1 to 3

Metal oxide materials were produced for comparison with the present invention.

Metal oxides having the intended compositions shown in Table 1 were produced by a high-pressure synthesis method in the same way as in Example 1.

The composition of Comparative Example 1 was $Bi(Zn_{0.5}Ti_{0.5})O_3$ and was found to have a tetragonal perovskite structure from the X-ray diffraction measurement. FIG. 1 shows the results obtained by the X-ray diffraction measurement in a 2θ/θ direction of the piezoelectric material of Comparative Example 1.

Only powdery sample was obtained from the oxide material in Comparative Example 1. This may be caused by the insufficient sintering density. Therefore, ferroelectricity, Curie temperature, and a dielectric constant could not be evaluated.

The composition of Comparative Example 2 was $BiAlO_3$, and was found to have a rhombohedral perovskite structure, which was slightly stretched in a c-axis direction from the X-ray diffraction measurement.

The composition of Comparative Example 3 was $BiFeO_3$, and was found to have a rhombohedral perovskite structure from the X-ray diffraction measurement.

Electrodes were formed on materials for metal oxides of Comparative Examples 2 and 3 in the same way as in Example 1 for electric measurement. Table 1 shows the results together with the compositions. The materials for metal oxides of Comparative Examples 2 and 3 had a dielectric constant smaller than that of the piezoelectric material of the examples and had a dielectric loss larger than that of the examples.

Table 1 shows that the Curie temperature of the metal oxide material of Comparative Example 2 is 600° C. or higher, which means that there is no Curie temperature in a range of 600° C. or lower. The above-mentioned "Chemistry of Materials" 2007, Vol. 19, No. 26, pp. 6385 to 6390 describes that $BiAlO_3$ has no Curie temperature at least in a temperature range of 520° C. or lower, and is decomposed at 550° C. or higher.

Further, Table 1 shows that the Curie temperature of the metal oxide material of Comparative Example 3 is 600° C. or higher. However, it is described that the Curie temperature of $BiFeO_3$ is about 830° C. (for example, Science 299, 1719 (2003)).

The piezoelectric strain of the piezoelectric materials of Comparative Examples 2 and 3 was observed in the same way as in Example 4. However, a strain of 0.01% or more that is a limit value of measurement precision was not confirmed.

Comparative Examples 4 and 5

Metal oxide films having the intended compositions shown in Table 2 were produced by a chemical solution deposition method in the same way as in Example 11.

The intended composition of Comparative Example 4 is $Bi(Zn_{0.5}Ti_{0.5})O_3$. However, it was found by the X-ray diffraction measurement that an intended compound was not obtained, and the obtained substance had no perovskite structure.

The composition of Comparative Example 5 was $BiFeO_3$, and was found to have a rhombohedral perovskite structure from the X-ray diffraction measurement.

Electrodes were formed on the metal oxide films in the same way as in Example 11 for electric measurement. Table 2 shows the results together with the compositions.

TABLE 1

| | A element | M element | x | y | Crystal System | Ferroelectricity | Curie temperature | Dielectric constant | Dielectric loss |
|---|---|---|---|---|---|---|---|---|---|
| Example 1 | Bi 100% | Fe 100% | 0.5 | 0.1 | Rhombohedral | ○ | 550° C. | 700 | 7.6% |
| Example 2 | Bi 100% | Fe 100% | 0.5 | 0.2 | Rhombohedral | ○ | 480° C. | 1,000 | 4.8% |
| Example 3 | Bi 100% | Fe 100% | 0.5 | 0.4 | Rhombohedral | ○ | 400° C. | 1,200 | 4.5% |
| Example 4 | Bi 100% | Fe 100% | 0.5 | 0.5 | Rhombohedral | ○ | 380° C. | 1,600 | 4.7% |
| Example 5 | Bi 100% | Fe 100% | 0.5 | 0.6 | Rhombohedral + Tetragonal | ○ | 360° C. | 1,500 | 5.2% |
| Example 6 | Bi 100% | Fe 100% | 0.5 | 0.7 | Tetragonal | ○ | 500° C. | 1,000 | 3.6% |
| Example 7 | Bi 100% | Fe 100% | 0.5 | 0.9 | Tetragonal | ○ | 600° C. or higher | 900 | 2.8% |
| Example 8 | Bi 100% | Al 100% | 0.5 | 0.2 | Rhombohedral | ○ | 460° C. | 600 | 3.5% |
| Example 9 | Bi 100% | Al 100% | 0.5 | 0.35 | Rhombohedral | ○ | 440° C. | 700 | 3.1% |
| Example 10 | Bi 100% | Al 100% | 0.5 | 0.5 | Rhombohedral + Tetragonal | ○ | 380° C. | 1,100 | 3.9% |

TABLE 1-continued

|  | A element | M element | x | y | Crystal System | Ferroelectricity | Curie temperature | Dielectric constant | Dielectric loss |
|---|---|---|---|---|---|---|---|---|---|
| Example 11 | Bi 100% | Al 100% | 0.5 | 0.8 | Tetragonal | o | 550° C. | 500 | 2.5% |
| Example 12 | Bi 99% La 1% | Fe 99% Mn 1% | 0.5 | 0.65 | Rhombohedral + Tetragonal | o | 300° C. | 1,200 | 5.8% |
| Example 13 | Bi 90% La 10% | Fe 70% Al 30% | 0.5 | 0.35 | Rhombohedral | o | 220° C. | 800 | 4.1% |
| Comparative Example 1 | Bi 100% | — | 0.5 | 1 | Tetragonal | — | — | — | — |
| Comparative Example 2 | Bi 100% | Al 100% | — | 0 | Rhombohedral | o | 600° C. or higher | 100 | 10% |
| Comparative Example 3 | Bi 100% | Fe 100% | — | 0 | Rhombohedral | o | 600° C. or higher | 100 | 16% |

TABLE 2

|  | A element | M element | x | y | Crystal System | Ferroelectricity | Curie temperature | Dielectric constant | Dielectric loss |
|---|---|---|---|---|---|---|---|---|---|
| Example 14 | Bi 100% | Fe 100% | 0.5 | 0.1 | Rhombohedral | o | 330° C. or higher | 600 | 4.6% |
| Example 15 | Bi 100% | Fe 100% | 0.5 | 0.2 | Rhombohedral | o | 330° C. or higher | 1,000 | 2.4% |
| Example 16 | Bi 100% | Fe 100% | 0.5 | 0.3 | Rhombohedral + Tetragonal | o | 330° C. or higher | 1,400 | 3.1% |
| Example 17 | Bi 100% | Fe 100% | 0.5 | 0.5 | Tetragonal | o | 330° C. or higher | 1,300 | 1.7% |
| Example 18 | Bi 100% | Fe 100% | 0.5 | 0.7 | Tetragonal | o | 330° C. or higher | 900 | 1.3% |
| Example 19 | Bi 100% | Fe 100% | 0.5 | 0.9 | Tetragonal | o | 330° C. or higher | 400 | 1.1% |
| Example 20 | Bi 100% | Al 100% | 0.4 | 0.3 | Rhombohedral + Tetragonal | o | 330° C. or higher | 600 | 0.8% |
| Example 21 | Bi 99.9% La 0.1% | Fe 50% Al 50% | 0.5 | 0.35 | Rhombohedral + Tetragonal | o | 320° C. | 1,200 | 1.0% |
| Example 22 | Bi 100% | Fe 99.9% Mn 0.1% | 0.6 | 0.3 | Rhombohedral + Tetragonal | o | 330° C. or higher | 600 | 2.0% |
| Example 23 | Bi 70% La 30% | Fe 95% Mn 5% | 0.5 | 0.25 | Rhombohedral + Tetragonal | o | 200° C. | 1,100 | 3.7% |
| Comparative Example 4 | Bi 100% | — | 0.5 | 1 | Non-Perovskite | x | — | — | — |
| Comparative Example 5 | Bi 100% | Fe 100% | — | 0 | Rhombohedral | o | 330° C. or higher | 200 | 8.8% |

According to Tables 1 and 2, all the piezoelectric materials of the present invention exhibit ferroelectricity. More specifically, it is understood that any of the materials in Examples 1 to 23 have piezoelectricity. Further, all the piezoelectric materials of the present invention have a Curie temperature of 200° C. or higher, and exhibit stable electric characteristics in a temperature range of −150° C. to 200° C.

Further, the piezoelectric materials of the present invention exhibit a dielectric constant larger than and a dielectric loss smaller than those of metal oxides of the comparative examples, which suggests that the piezoelectric materials of the present invention are also more excellent in piezoelectricity.

The piezoelectric material of the present invention is also applicable to a MEMS technique, exhibits satisfactory piezoelectricity even at a high temperature, and is environmentally clean. Therefore, the piezoelectric material of the present invention can be used for appliances using many piezoelectric materials, such as an ultrasonic motor and a piezoelectric element, without any problems.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-196903, filed Jul. 30, 2008, which is hereby incorporated by reference herein in its entirety.

What is claimed is:

1. A metal oxide comprising a perovskite-type oxide represented by general formula (1):

$$A(Zn_xTi_{(1-x)})_yM_{(1-y)}O_3 \quad (1),$$

wherein A represents at least one trivalent lanthanoid and at least one trivalent metal element containing at least a Bi element; M represents at least one element selected from the group consisting of Fe, Al, Sc, Mn, Y, Ga, and Yb; x represents a numerical value satisfying $0.4 \leq x \leq 0.6$; and y represents a numerical value satisfying $0.1 \leq y \leq 0.9$.

2. The metal oxide according to claim 1, wherein A contains an La element.

3. The metal oxide according to claim 2, wherein a ratio of the Bi element accounting for A is 70 mol % or more to 99.9 mol % or less.

4. The metal oxide according to claim 1, wherein M is made of at least one of Fe and Al or both of Fe and Al.

5. The metal oxide according to claim 2, wherein M contains an Mn element in an amount of 0.1 mol % or more to 5 mol % or less.

6. The metal oxide according to claim 1, wherein y satisfies $0.2 \leq y \leq 0.65$.

7. A piezoelectric material comprising the metal oxide according to claim 1.

8. The metal oxide according to claim 1, which is a film with a thickness of 200 nm or more to 10 μm or less provided on a substrate.

9. The metal oxide according to claim 8, which is a film formed by a chemical solution deposition method.

10. The metal oxide according to claim 8, wherein the substrate is a single crystal substrate selectively (001) oriented or (111) oriented.

11. The metal oxide according to claim 8, which has a film shape, and y satisfies $0.2 \leqq y \leqq 0.35$.

12. The metal oxide according to claim 1, which is a bulk solid, and y satisfies $0.35 \leqq y \leqq 0.65$.

* * * * *